(12) United States Patent
Farquhar et al.

(10) Patent No.: US 8,061,155 B2
(45) Date of Patent: Nov. 22, 2011

(54) TEMPERATURE CONTROL APPARATUS FOR A HARD DISK DRIVE AND A METHOD OF VARYING THE TEMPERATURE OF A HARD DISK DRIVE

(75) Inventors: David Ronald Bain Farquhar, Chichester (GB); David John Orris, Locksheath (GB)

(73) Assignee: Xyratex Technology Limited, Havant (GB)

( * ) Notice: Subject to any disclaimer, the term of this patent is extended or adjusted under 35 U.S.C. 154(b) by 309 days.

(21) Appl. No.: 11/665,806

(22) PCT Filed: Oct. 27, 2005

(86) PCT No.: PCT/GB2005/004150
§ 371 (c)(1),
(2), (4) Date: Apr. 19, 2007

(87) PCT Pub. No.: WO2006/048611
PCT Pub. Date: May 11, 2006

(65) Prior Publication Data
US 2008/0112075 A1 May 15, 2008

Related U.S. Application Data

(60) Provisional application No. 60/624,173, filed on Nov. 3, 2004.

(51) Int. Cl.
*F25D 23/12* (2006.01)
(52) U.S. Cl. ............ 62/259.2; 62/3.2; 361/694; 361/690
(58) Field of Classification Search ..................... 62/3.2, 62/259.2; 361/694, 690
See application file for complete search history.

(56) References Cited

U.S. PATENT DOCUMENTS

| | | | | |
|---|---|---|---|---|
| 4,315,300 A | * | 2/1982 | Parmerlee et al. | 361/703 |
| 5,040,095 A | * | 8/1991 | Beaty et al. | 361/694 |
| 5,263,537 A | * | 11/1993 | Plucinski | |
| 5,851,143 A | * | 12/1998 | Hamid | 454/57 |
| 5,914,856 A | * | 6/1999 | Morton et al. | 361/690 |
| 6,055,814 A | * | 5/2000 | Song | 62/3.2 |
| 6,252,769 B1 | * | 6/2001 | Tullstedt et al. | 361/694 |
| 6,544,309 B1 | * | 4/2003 | Hoefer | |
| 6,760,222 B1 | * | 7/2004 | Wang | 361/700 |

(Continued)

FOREIGN PATENT DOCUMENTS
DE 102 32 692 * 2/2004

OTHER PUBLICATIONS

International Search Report and Written Opinion in PCT/GB2005/004150, dated Feb. 2, 2007.*
Patent Abstracts of Japan of JP 03 052183, vol. 015, No. 205, May 27, 1991.*

(Continued)

*Primary Examiner* — Cheryl J Tyler
*Assistant Examiner* — Jonathan Koagel
(74) *Attorney, Agent, or Firm* — Pillsbury Winthrop Shaw Pittman LLP

(57) ABSTRACT

A temperature control apparatus for a hard disk drive includes a thermal chamber for receiving the hard disk drive. The apparatus also includes an oscillatory air movement generator for generating air movement within a region between the thermal chamber and the hard disk drive when the hard disk is received in the thermal chamber, thereby to facilitate heat transfer between the thermal chamber and the hard disk drive.

19 Claims, 3 Drawing Sheets

U.S. PATENT DOCUMENTS 6,798,657 B1* 9/2004 Clifton
2002/0093791 A1* 7/2002 Chiriac
2003/0192674 A1* 10/2003 Ippoushi
2004/0035555 A1* 2/2004 Nara

OTHER PUBLICATIONS

Examination Report issued in related. British application No. GB0703732.8, Nov. 22, 2007, 2 pages.

* cited by examiner

TEMPERATURE CONTROL APPARATUS FOR A HARD DISK DRIVE AND A METHOD OF VARYING THE TEMPERATURE OF A HARD DISK DRIVE

CROSS REFERENCE TO RELATED APPLICATIONS

This is the U.S. National Phase of PCT/GB2005/004150, filed Oct. 27, 2005, which in turn claims priority to U.S. provisional application Ser. No. 60/624,173, filed Nov. 3, 2004, both of which are incorporated herein in their entirety by reference.

The present invention relates to a temperature control apparatus for a hard disk drive and a method of varying the temperature of a hard disk drive.

During manufacture of hard disk drives it is necessary to test the hard disk drives to ensure that they meet required specifications. As part of the testing, it is necessary to control the temperature of the hard disk drives. The temperature of the hard disk drives is varied across a wide range during testing.

It is also desirable to maintain the temperature of a hard disk drive to be within a predetermined range during normal operation of the hard disk drive, i.e. when the hard disk drive is in normal use by an end user.

It is known to test hard disk drives in apparatus including a test rack comprising a framework matrix for receiving housings each containing a hard disk drive for testing. To provide control of the temperature to which a hard disk drive is exposed during testing, a cooling system including one or more heat exchangers is typically provided associated with the test rack. These heat exchangers generate cool air that is then provided to cool both control electronics associated with each housing and to cool the hard disk drive(s) being tested. A heat source may also be provided to heat the hard disk drives during testing.

Conventionally, radial or centrifugal fans are used to generate airflow to move the cooled air via various ducted pathways over the control electronics and the hard disk drive(s) within the housings. Typically, separate fans are used to generate airflow for cooling the control electronics and the hard disk drive(s) being tested. A problem with the use of fans to generate the airflow is that they introduce vibration to the apparatus that can severely affect hard disk drive testing.

According to a first aspect of the present invention, there is provided a temperature control apparatus for a hard disk drive, the apparatus comprising:

a thermal chamber for receiving a hard disk drive;

an oscillatory air movement generator for generating air movement within a region between the thermal chamber and a said hard disk drive when received in the thermal chamber, thereby to facilitate heat transfer between the thermal chamber and a said hard disk drive.

In contrast to conventional systems in which radial or centrifugal fans are used in combination with a heat exchanger to generate airflow for controlling the temperature of a hard disk drive, in embodiments of the present invention an oscillatory air movement generator is provided for generating air movement within the region between a thermal chamber and a hard disk drive in normal use or during testing. This reduces the unwanted vibration to which a hard disk drive would otherwise be exposed. Furthermore, the nature of the air movement within a region between the thermal chamber and a hard disk drive when received in the thermal chamber enables the volume that is maintained at a desired temperature around a hard disk drive in use or during tested to be localised around the hard disk drive.

The temperature control apparatus may be provided as part of a hard disk drive test apparatus. Alternatively, the temperature control apparatus may be provided for control of the temperature of a hard disk drive during normal use.

In one example, the oscillatory air movement generator is a voice-coil motor connected to a diaphragm. Alternatively, the oscillatory air movement generator may be a piezo electric element or bellows.

Preferably, the apparatus comprises plural thermal chambers each for receiving a respective hard disk drive; and, an oscillatory air movement generator for generating air movement within a region between each of the thermal chambers and a said hard disk drive when received in each of the thermal chambers thereby to facilitate heat transfer between a said hard disk drive received in use within each of the thermal chambers and the respective thermal chamber.

Preferably baffles are provided between individual ones of the thermal chambers. These provide thermal isolation to individual ones of the thermal chambers and enable only a single air-moving actuator to be used to generate the air movement for plural thermal chambers.

According to a second aspect of the present invention, there is provided a method of varying the temperature of a hard disk drive in a thermal chamber, the method comprising:

generating non-mass flow air movement in the region between the hard disk drive and the thermal chamber to facilitate efficient heat transfer therebetween.

According to a third aspect of the present invention, there is provided a temperature control apparatus for a hard disk drive, the apparatus comprising:

a thermal chamber for receiving a hard disk drive, wherein when a said hard disk drive is received within the thermal chamber heat transfer between the thermal chamber and the said hard disk drive is enabled by air movement within a region between the thermal chamber and the said hard disk drive.

In embodiments, the invention provides a hard disk drive test apparatus in which non-mass flow air movement is used to disturb the air within the region between a hard disk drive arranged in a thermal chamber and the thermal chamber itself. This improves the transfer of heat between the thermal chamber and a hard disk drive arranged in the apparatus in use, e.g. during testing, whilst avoiding the problems of vibration encountered with the use of radial or centrifugal fans.

In an alternative aspect of the present invention, there is provided a temperature control apparatus for a hard disk drive, the apparatus comprising:

a thermal chamber for receiving a hard disk drive; and an air movement generator for generating air movement within a region between the thermal chamber and a said hard disk drive when received in the thermal chamber, thereby to facilitate heat transfer between the thermal chamber and a said hard disk drive.

Examples of the present invention will now be described in detail, with reference to the accompanying drawings, in which.

Figure 1:
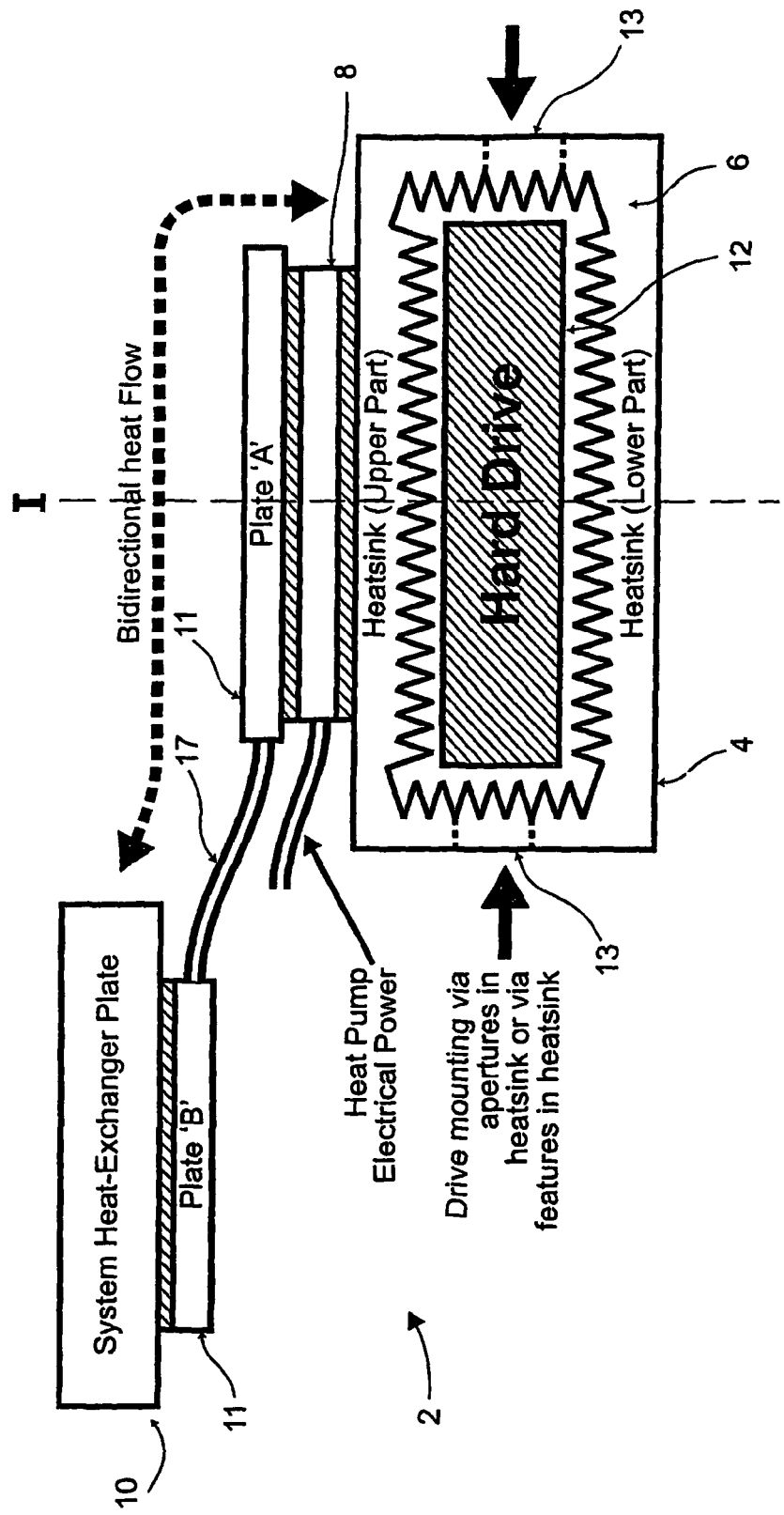
FIG. 1 shows an example of a temperature control apparatus according to an embodiment of the present invention.

FIG. 1 shows an example of a temperature control apparatus according to an embodiment of the present invention. The apparatus 2 comprises a thermal chamber 6 for receiving a hard disk drive 12. The thermal chamber 6 can function both as a heat sink and as a heat source. In use the temperature control apparatus would typically be provided within a framework matrix as will be described below with reference to FIG. 3. The thermal chamber 6 may typically be an appropriately shaped block of metal having fins and ducts as required to facilitate efficient heat transfer via air between a hard disk drive being tested and the thermal chamber.

In the particular embodiment shown, a heat pump 8 is provided in thermal communication with the thermal chamber 6. A heat exchanger 10 is also provided in thermal communication with the heat pump 8. By varying the operation of the heat pump 8, the temperature of the thermal chamber 6 and therefore the environmental temperature to which the hard disk drive 12 is exposed, may be varied. The heat pump 8 is connected to the heat exchanger 10 via plates 11 and a heat pipe 17 that in combination enable bidirectional heat transfer i.e. heat transfer in both directions between the heat pump 8 and the heat exchanger 10.

The heat pipe is preferably flexible. This enables the plate B to be moved away from the system heat exchanger. Preferably, a selectively reconfigurable connector (not shown) is provided to enable connection and disconnection of the plate B and the heat exchanger 10.

A heat pipe is a preferred type of device for enabling transfer of heat between the pump 8 and the heat exchanger 10. This is because the heat pipe is efficient, has a low volume and no moving parts. Any device that can transfer heat from the pump 8 to the heat exchanger 10 can be used, e.g., ducts for a flowing heat transfer fluid could be used.

With respect to the thermal chamber the heat pump 8 functions as a heat source or as a heat receiver. Any device that can provide this functionality may be used. Indeed, any type of heat pump that is capable of pumping heat into and/or out of an object may be used. A particularly preferred example is a peltier device. A peltier heat pump typically can enable cooling to temperatures less than 0° C. In the example shown in FIG. 1, the heat pump 8, plates 11 and heat pipe 17 enable heat to flow both to and from the heat exchanger 10 in dependence on the desired temperature of the hard disk drive 12.

The thermal chamber 6 is provided with apertures 15 to enable mounting of the thermal chamber in a suitable carrier. When used for testing a hard disk drive the thermal chamber may be mounted in a structure such as a framework matrix for receiving plural thermal chambers.

The thermal chamber may have dimensions such that a hard disk drive received within it is in close proximity to the inner walls of the thermal chamber. Heat transfer may then be effected between the hard disk drive and the thermal chamber by convective currents. In this example there would be no requirement for an oscillatory air flow generator. In both cases heat transfer is effected in the region between the thermal chamber and a hard disk drive by non-mass flow movement of air within the thermal chamber, but substantially not through the chamber. In other words, the air within the thermal chamber is agitated or disturbed thereby generating non-mass flow air movement.

In the case where a small volume of air is provided within the region between a hard disk drive and the thermal chamber a purge of air is easily accomplished. This may be desirable since it enables any water content contained in the air originally in the chamber to be removed so that if the hard disk drive is then cooled to below the dew point of air no condensation will be formed. Furthermore, the low volume of air within the region between a hard disk drive and the thermal chamber also means that even if no purge of air is performed, the amount of condensation formed will be minimal.

Figure 2:
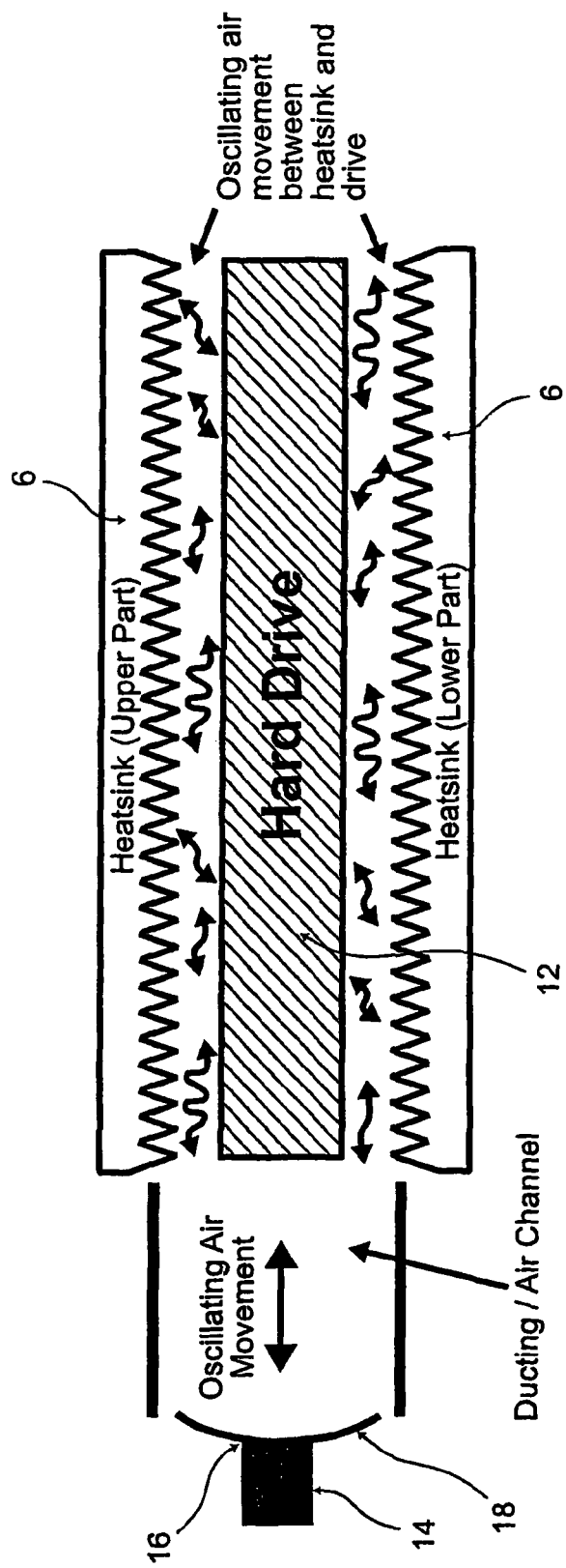
FIG. 2 shows a sectional side view of the temperature control apparatus of FIG. 1; and, FIG. 3 shows a plan view of an example of a temperature control apparatus according to an embodiment of the present invention.

Referring now to FIG. 2, a section along the line II' through FIG. 1 is shown. For clarity in FIG. 2, the heat pump 8 is omitted. As can be seen in FIG. 2, in this example an air-moving actuator 14 is provided. The air-moving actuator 14 is an example of an oscillatory or non-mass flow air movement generator and serves to generate oscillatory or non-mass flow air movement within the region between the hard disk drive 12 and the thermal chamber 6. This air movement improves the efficiency of heat transfer between the thermal chamber 6 and the hard disk drive 12.

The movement of the air-moving actuator 14 that generates the air movement is substantially translational. It will be understood that air within the region between the thermal chamber and the hard disk drive is effectively disturbed in a non-mass flow manner such that heat transfer is enabled between the thermal chamber and the hard disk drive by the volume of air filling the region. In other words there is substantially no aggregate mass flow of air into or out of the region between the inner walls of the thermal chamber and the hard disk drive. However, the air within this region is agitated such that heat transfer is enabled between the thermal chamber and the hard disk drive.

The air moving actuator 14 may be remote from the thermal chamber. Alternatively the actuator could be arranged adjacent to the thermal chamber or even embedded within the body of the thermal chamber. In one embodiment the air movement actuator comprises two components arranged in use on opposite sides of the thermal chamber. The components are arranged to operate in an alternate fashion such that on aggregate non-mass flow air movement is generated within the region between the thermal chamber and a hard disk drive arranged within it.

The vibration to which the hard disk drive 12 is subjected during operation of the actuator 14 is significantly reduced in comparison to that that it would experience if a conventional rotary fan were used to generate air movement. This is due in part to the reduced coupling between the actuator 14 and the hard disk drive compared to that between a conventional rotary fan and a hard disk drive in a similar arrangement.

In addition, where low frequency oscillatory air movement is used, the effect on the hard disk drive is minimal since the servo loops in hard disk drives are typically less sensitive to low frequency vibrations. Typically, the frequency of oscillation is less than or equal to about 30 Hz. The frequency and wave shape of the air movement may be optimised for the application and particular hard disk drive being used or tested. At present, for hard disk drives the frequency might be less than or equal to about 30 Hz. In the future, hard disk drives may require different optimisations.

Furthermore, the fact that the air movement is oscillatory or non-mass flow has the effect that the air remains substantially local to the hard disk drive being tested. As will be explained below with reference to FIG. 3, this provides the advantage that a single air-moving actuator may be used for plural hard disk drives.

In the example shown in FIG. 2, the air-moving actuator comprises a voice-coil motor 16 connected to a diaphragm 18. This is commonly referred to as a loudspeaker. It will be appreciated that other means may be utilised that are also capable of generating non-mass flow air movement in the region between the hard disk drive 12 and the thermal chamber 6, thereby increasing the efficiency of heat transfer between the heat exchanger and the hard disk drive 12. For example, a piezo-electric element may be used instead of the voice-coil motor.

In some examples, there may be actual physical contact between a hard disk drive and the thermal chamber receiving it such that heat transfer between the two may also be effected, in part, by conduction.

Figure 3:
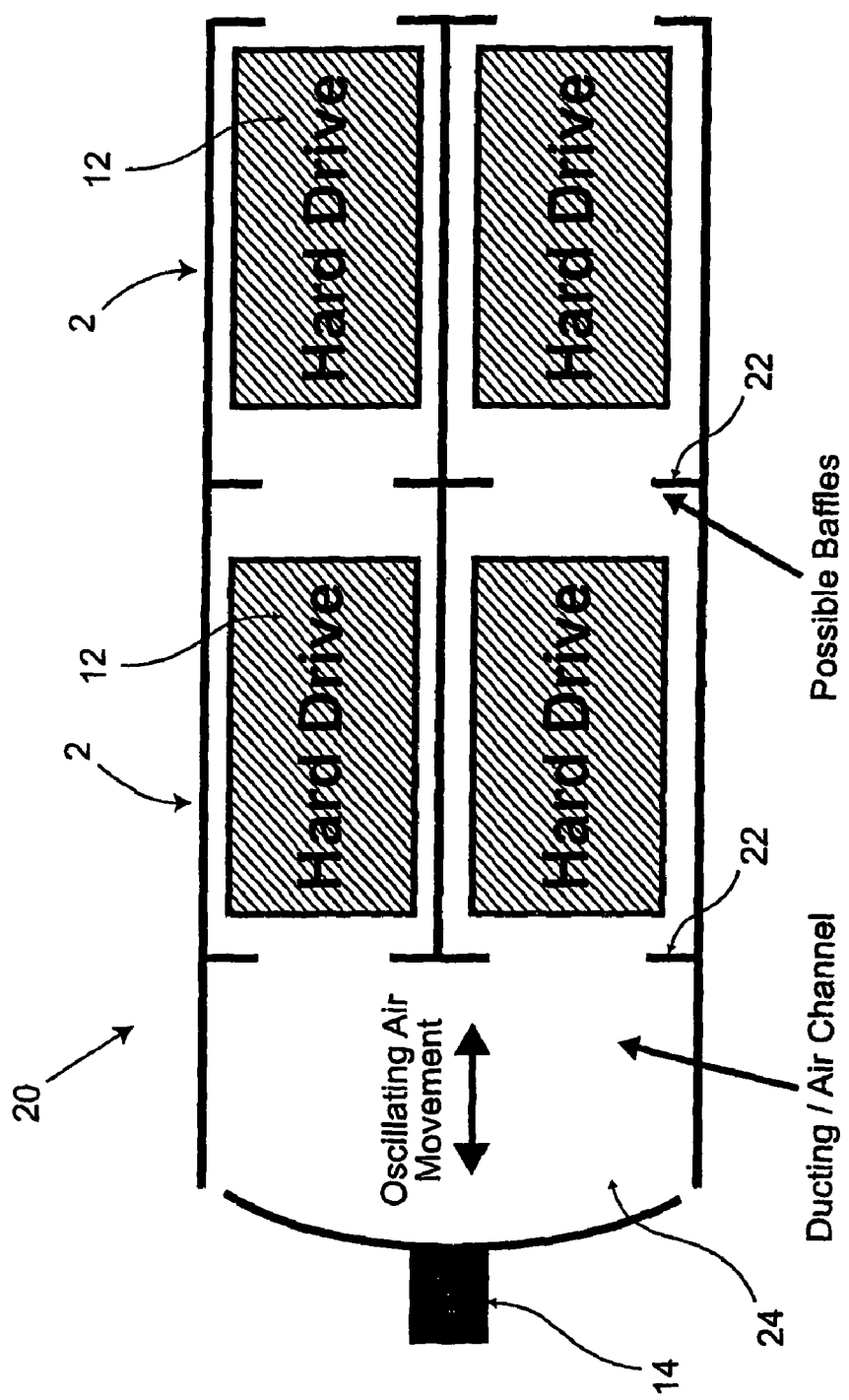

FIG. 3 shows an example of hard disk drive test apparatus including temperature control apparatus according to an embodiment of the present invention. The figure shows a schematic plan view of a horizontal section through the hard disk drive test apparatus. The test apparatus includes temperature control apparatus as shown in and described above with reference to FIGS. 1 and 2 that may be used to vary the temperatures to which plural hard disk drives are exposed.

The test apparatus 20 comprises a framework matrix containing a plurality of temperature control apparatuses. Each temperature control apparatus is mounted directly within the framework matrix. Apertures 15 within the thermal chamber 6 enable the hard disk drive within the thermal chamber optionally to be mounted to something other than the thermal chamber itself for optimisation of vibrational performance. As in the example shown in FIG. 2, an air moving actuator 14 is provided for generating non-mass flow air movement although the test apparatus may be provided without an air moving actuator 14. An air channel 24 provides a route for transferring movement of the air from the actuator to within the apparatus 20. In the specific example shown, the route is provided by ducting.

In the example shown, a single air-moving actuator is provided for generating the air movement for plural hard disk drives. A number of separating baffles 22 are provided for limiting the thermal interaction between hard disk drives 12 in the test apparatus. This enables a single actuator 14 to be utilised to provide air movement for regulating the temperature of plural disk drives 12. In addition limiting thermal interaction between hard disk drives enables one actuator to be used for multiple hard disk drives, possibly each at a different temperature. Of course, a dedicated air-moving actuator 14 may be provided for each of the hard disk drives.

Embodiments of the present invention have been described with particular reference to the examples illustrated. However, it will be appreciated that variations and modifications may be made to the examples described within the scope of the present invention.

The invention claimed is:

1. A temperature control apparatus for a hard disk drive, the apparatus comprising:
    a thermal chamber configured to receive the hard disk drive;
    a heat conductive heat source or heat conductive receiver or both a heat conductive heat source and heat conductive receiver provided within the thermal chamber and arranged so as to be above and below and spaced apart from the disk drive when the disk drive is provided in the thermal chamber;
    an oscillatory air movement generator that generates air movement within a region above and below the disk drive in a space between the heat conductive heat source or heat conductive receiver or both the heat conductive heat source and heat conductive receiver within the thermal chamber and said hard disk drive when said hard disk drive is received in the thermal chamber, and
    wherein the air movement is a non-mass flow air movement within the chamber, and wherein when the oscillatory air movement generator generates air movement and when the disk drive is received within the thermal chamber, there is substantially no aggregate mass flow of air into or out of the thermal chamber, facilitating heat transfer between the heat conductive heat source or heat conductive receiver or both the heat conductive heat source and heat conductive receiver and said hard disk drive.

2. An apparatus according to claim 1, wherein the oscillatory air movement generator comprises a diaphragm driven in an oscillatory manner by a driver.

3. An apparatus according to claim 2, wherein the driver is a voice-coil motor.

4. An apparatus according to claim 1, wherein the oscillatory air movement generator is a piezo-electric element.

5. An apparatus according to claim 1, further comprising a heat pump in thermal communication with the heat conductive heat source or heat conductive receiver or both the heat conductive heat source and heat conductive receiver within the thermal chamber for pumping heat to and from the heat conductive heat source or heat conductive receiver or both the heat conductive heat source and heat conductive receiver.

6. An apparatus according to claim 5, wherein the heat pump is a peltier heat pump.

7. An apparatus according to claim 5, further comprising a heat exchanger coupled to the heat pump selectively to provide heat to or receive heat from the heat pump.

8. An apparatus according to claim 7, further comprising a heat pipe to transfer heat from the pump to the heat exchanger and vice versa.

9. An apparatus according to claim 1, further comprising the hard disk drive arranged within the thermal chamber.

10. An apparatus according to claim 2, further comprising:
    plural thermal chambers, each of the thermal chambers being configured to receive a respective hard disk drive;
    wherein the oscillatory air movement generator is configured to generate air movement in the region between each of the heat conductive heat sources or heat conductive receivers or both the heat conductive heat sources and heat conductive receivers and said respective hard disk drive when said respective hard disk drive is received in each of the heat conductive heat sources or heat conductive receivers or both the heat conductive heat sources and heat conductive receivers, thereby to facilitate heat transfer between said respective hard disk drive arranged in use within a respective heat conductive heat source or heat conductive receiver or both heat conductive heat source and heat conductive receiver and the respective thermal chamber.

11. An apparatus according to claim 10, further comprising baffles arranged between respective thermal chambers thereby limiting thermal interaction between the thermal chambers.

12. An apparatus according to claim 10, further comprising a respective heat pump for each of the plural thermal chambers.

13. An apparatus according to claim 10, further comprising a unitary oscillatory air movement generator for generating the air movement for one or more of the thermal chambers.

14. An apparatus according to claim 10, further comprising a framework for receiving each of the plural thermal chambers and maintaining said plural thermal chambers in a substantially fixed spatial relationship to each other.

15. A hard disk drive test apparatus comprising a temperature control apparatus according claim 1.

16. A method of varying the temperature of a hard disk drive using a heat conductive heat source or heat conductive receiver or both a heat conductive heat source and heat conductive receiver within a thermal chamber, the method comprising:

generating non-mass flow air movement above and below the hard disk drive in a space between the hard disk drive and the heat conductive heat source or heat conductive receiver or both the heat conductive heat source and heat conductive receiver, the hard disk drive being spaced apart from the heat conductive heat source or heat conductive receiver or both the heat conductive heat source and heat conductive receiver, wherein there is substantially no aggregate mass flow of air into or out of the thermal chamber, thereby to facilitate efficient heat transfer between said hard disk drive and the heat conductive heat source or heat conductive receiver or both the heat conductive heat source and heat conductive receiver.

17. A method of testing the hard disk drive or a plurality of hard disk drives when arranged in a hard disk drive test apparatus according to claim 16, the method comprising:
generating non-mass flow air movement between the one or each hard disk drive and corresponding one or each heat conductive heat source or heat conductive receiver or both the heat conductive heat source and heat conductive receiver within the respective thermal chamber to facilitate efficient heat transfer between the one or each hard disk drive and one or each corresponding heat source or heat conductive receiver or both heat source and heat conductive receiver.

18. A method according to claim 16, wherein there are plural thermal chambers, the method comprising:
independently controlling the temperatures of the thermal chambers so that different ones of a plural hard disk drives may be controlled to be at corresponding different temperatures.

19. A temperature control apparatus for a hard disk drive, the apparatus comprising:
a heat conductive heat source or heat conductive receiver or both a heat conductive heat source and heat conductive receiver configured to receive the hard disk drive, the heat conductive source or heat conductive receiver or both being arranged both above and below and spaced apart from said hard disk drive,
a thermal chamber configured to receive the heat conductive heat source or heat conductive receiver or both the heat conductive heat source and heat conductive receiver, the thermal chamber having an opening through which the hard disk drive is inserted or removed,
wherein when said hard disk drive is received within the thermal chamber, heat transfer between the thermal chamber and said hard disk drive is enabled by non-mass flow air movement in a region between the heat conductive heat source or heat conductive receiver or both the heat conductive heat source and heat conductive receiver and said hard disk drive, wherein an air movement generator generates the non-mass flow air movement via the opening above and below the hard disk drive.

* * * * *